United States Patent
Son

(10) Patent No.: US 8,834,673 B2
(45) Date of Patent: Sep. 16, 2014

(54) PROCESS CHAMBER HAVING GATE SLIT OPENING AND CLOSING APPARATUS

(75) Inventor: Hyoung Kyu Son, Seoul (KR)

(73) Assignee: ADP Engineering Co., Ltd. (KR)

( * ) Notice: Subject to any disclaimer, the term of this patent is extended or adjusted under 35 U.S.C. 154(b) by 676 days.

(21) Appl. No.: 11/869,878

(22) Filed: Oct. 10, 2007

(65) Prior Publication Data

US 2008/0110568 A1 May 15, 2008

(30) Foreign Application Priority Data

Nov. 10, 2006 (KR) .................. 10-2006-0111099

(51) Int. Cl.
*C23F 1/00* (2006.01)
*C23C 16/00* (2006.01)
*H01J 37/32* (2006.01)
*H01L 21/67* (2006.01)

(52) U.S. Cl.
CPC ..... *H01L 21/67126* (2013.01); *H01J 37/32458* (2013.01); *H01L 37/185* (2013.01); *H01L 2237/184* (2013.01)
USPC ..................... 156/345.31; 118/733

(58) Field of Classification Search
USPC ............. 118/733, 719; 156/345.31, 345.32; 251/212, 301
See application file for complete search history.

(56) References Cited

U.S. PATENT DOCUMENTS

| | | | | |
|---|---|---|---|---|
| 4,785,962 A | * | 11/1988 | Toshima | 220/260 |
| 4,871,417 A | * | 10/1989 | Nishizawa et al. | 438/748 |
| 6,095,741 A | * | 8/2000 | Kroeker et al. | 414/217 |
| 6,386,511 B1 | * | 5/2002 | Watanabe et al. | 251/301 |
| 6,541,353 B1 | * | 4/2003 | Sandhu et al. | 438/478 |
| 7,247,207 B2 | * | 7/2007 | Makino et al. | 118/719 |
| 7,641,069 B2 | * | 1/2010 | Tauchi et al. | 220/661 |
| 2005/0051093 A1 | | 3/2005 | Makino et al. | |

FOREIGN PATENT DOCUMENTS

| | | |
|---|---|---|
| JP | 57-200558 | 12/1982 |
| JP | 63-14434 | 1/1988 |
| JP | 8-210556 | 8/1996 |
| JP | 2004141803 A * | 5/2004 |
| JP | 2005-105580 | 4/2005 |
| KR | 10-0238944 | 1/2000 |

OTHER PUBLICATIONS

Korean Office Action dated Sep. 5, 2013.
Taiwanese Office Action dated Feb. 10, 2011. (Application No. 096140673).

* cited by examiner

*Primary Examiner* — Karla Moore
(74) *Attorney, Agent, or Firm* — Ked & Associates, LLP

(57) ABSTRACT

A process chamber is provided for an etching apparatus that etches a substrate, such as a liquid crystal display (LCD) substrate, using plasma. The process chamber may include a chamber body, in one wall of which a gate slit is formed, a rotary inner door that opens and closes an inner opening of the gate slit, and a door driving mechanism that rotates the inner door. When the substrate is etched, the inner door is closed preventing an interior of the chamber body from communicating with the gate slit. Thereby, a space in which the plasma is formed may be maintained symmetrical, so that the plasma may be uniformly distributed in an interior of the chamber body.

19 Claims, 8 Drawing Sheets

PROCESS CHAMBER HAVING GATE SLIT OPENING AND CLOSING APPARATUS

This application claims priority to Korean Patent Application No. 10-2006-0111099, filed in Korea on Nov. 10, 2006, which is hereby incorporated by reference in its entirety.

BACKGROUND

1. Field

A process chamber having a gate slit opening and closing apparatus is disclosed herein.

2. Description of the Related Art

Process chambers are known. However, they suffer from various disadvantages.

BRIEF DESCRIPTION OF THE DRAWINGS

Embodiments will be described in detail with reference to the following drawings in which like reference numerals refer to like elements, and wherein.

DETAILED DESCRIPTION

Figure 1:
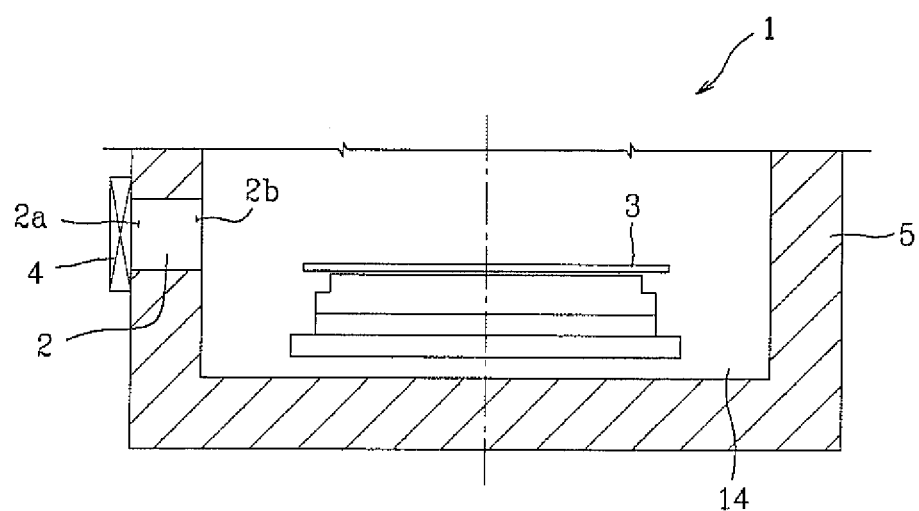
FIG. 1 is a cross-sectional view of a process chamber according to an embodiment.

Reference will now be made in detail to embodiments, examples of which are illustrated in the accompanying drawings. Wherever possible, like reference numerals have been used throughout the drawings and the description to refer to the same or like parts, and repetitive disclosure has been omitted.

In order to fabricate a display substrate, such as a liquid crystal display (LCD) substrate, an apparatus that etches the substrate is required. Such an etching apparatus is designed to inject a specific reaction gas between two electrodes between which a strong electric field has been formed. This converts the reaction gas to plasma having good reactivity in a neutral state while the reaction gas releases electrons under the electric field. The plasma reacts with portions of an oxide film, which has been deposited on a substrate and exposed in portions not covered with a photoresist, thereby etching the substrate. The etching apparatus may include a process chamber, in which a substrate may be processed using plasma, a load lock chamber in which the substrate may be stored, and a transfer chamber located between the process chamber and the load lock chamber and serving as a transit zone through which the substrate may be loaded and unloaded.

FIG. 1 shows a process chamber of an etching apparatus for a display substrate, such as a LCD substrate. As shown in FIG. 1, the process chamber 1 may include a chamber body 5, a gate slit 2, formed in a wall of the chamber body 5 so as to communicate with the transfer chamber, and a gate valve 4 that opens and closes the gate slit 2. The gate slit 2 may function as a gateway for a substrate 3 and may be long in a horizontal direction. The gate valve 4 may be opened to allow the substrate 3 to pass through the gate slit 2 when the substrate 3 is loaded or unloaded. As soon as the substrate 3 is loaded or unloaded, the gate valve 4 may be closed so that a vacuum may be created in an interior 14 of the process chamber 1.

However, as illustrated in FIG. 1, the above-mentioned process chamber is adapted so that the gate valve 4 is installed outside the process chamber 1 so as to open and close the gate slit 2. For this reason, when shut, the gate valve 4 closes an outer opening 2a of opposite openings 2a and 2b of the gate slit 2. Hence, while the substrate is etched, the interior 14 of the process chamber 1 spatially communicates with the gate slit 2. Accordingly, a space in which the plasma is formed includes the space of the gate slit 2 in addition to the space of the interior 14 of the process chamber 1. As a result, the plasma is subjected to differential distribution (that is, it is more concentrated toward the gate slit 2), and thus, the substrate 3 is also subjected to differential etching.

In other words, when the interior 14 of the process chamber 1 is divided into two portions: the gate slit portion and the opposite portion (i.e. left and right sides with respect to a central line when viewed in FIG. 1), the plasma space on the gate slit 2 portion is wider by the space of the gate slit 2. Hence, when it is viewed overall, the plasma space cannot avoid being left-right asymmetrical. Accordingly, the plasma may be concentrated toward the gate slit 2 while the substrate 3 is etched.

Figure 2:
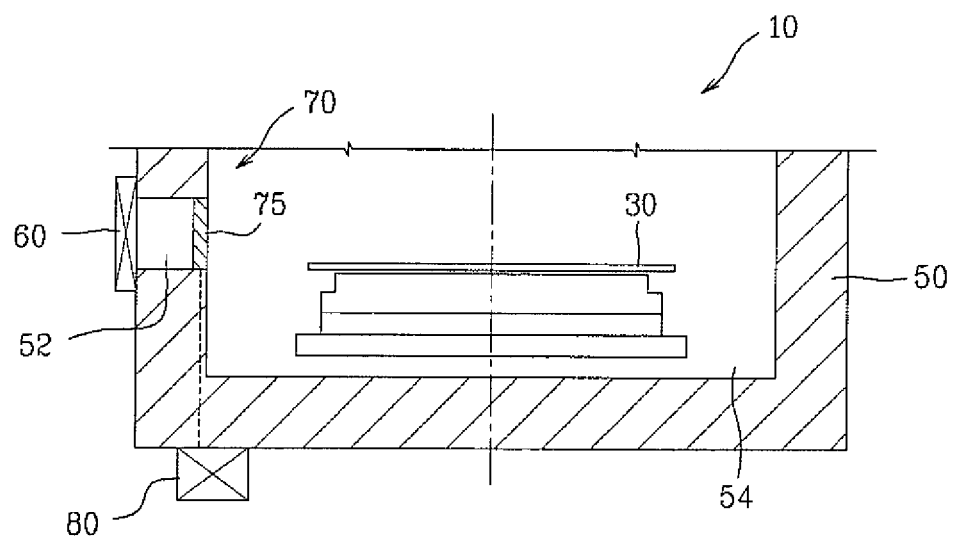
FIG. 2 is a diagram illustrating a process chamber having a gate slit opening and closing apparatus in accordance with an embodiment.

FIG. 2 is a diagram illustrating a process chamber 10 having a gate slit opening and closing apparatus 70 in accordance with an embodiment. As illustrated in FIG. 2, the process chamber 40 having a gate slit opening and closing apparatus 70, in accordance with an embodiment may include a chamber body 50, in which a space 54 in which a substrate 30 may be etched using plasma is defined, and in one wall of which a gate slit 52, through which the substrate 30 may be loaded and unloaded, is formed, and a gate valve 60. The gate slit opening and closing apparatus 70 opens and closes the gate slit 52 of the chamber body 50 inside the chamber body 50. The gate valve 60 opens and closes the gate slit 52 of the chamber body 50 outside the chamber body 50.

Figure 3:
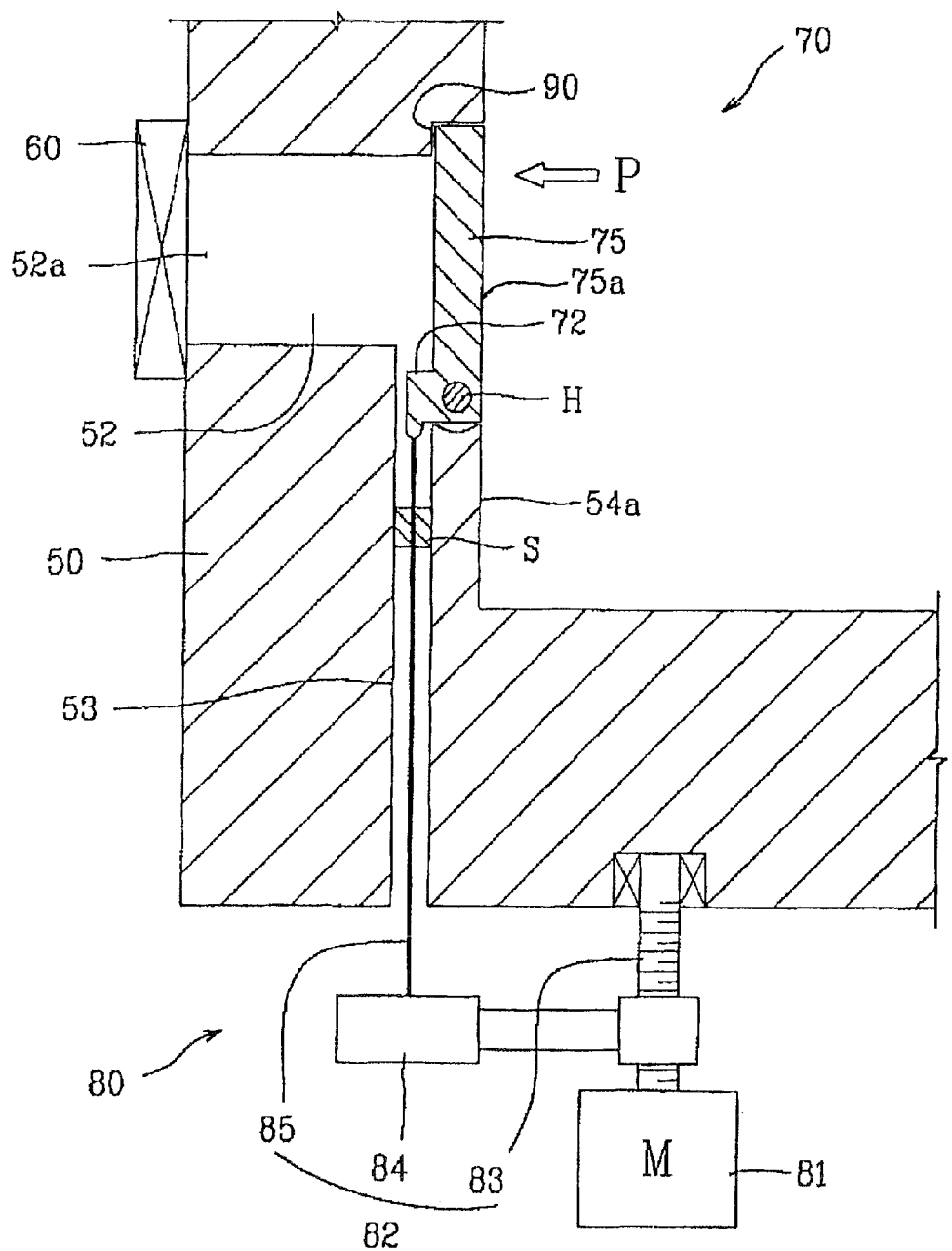
FIGS. 3 and 4 are detailed sectional views of the gate slit opening and closing apparatus of FIG. 2, FIG. 3 showing a state in which the gate, slit is open, and FIG. 4 showing a state in which the gate slit is closed.
Figure 4:
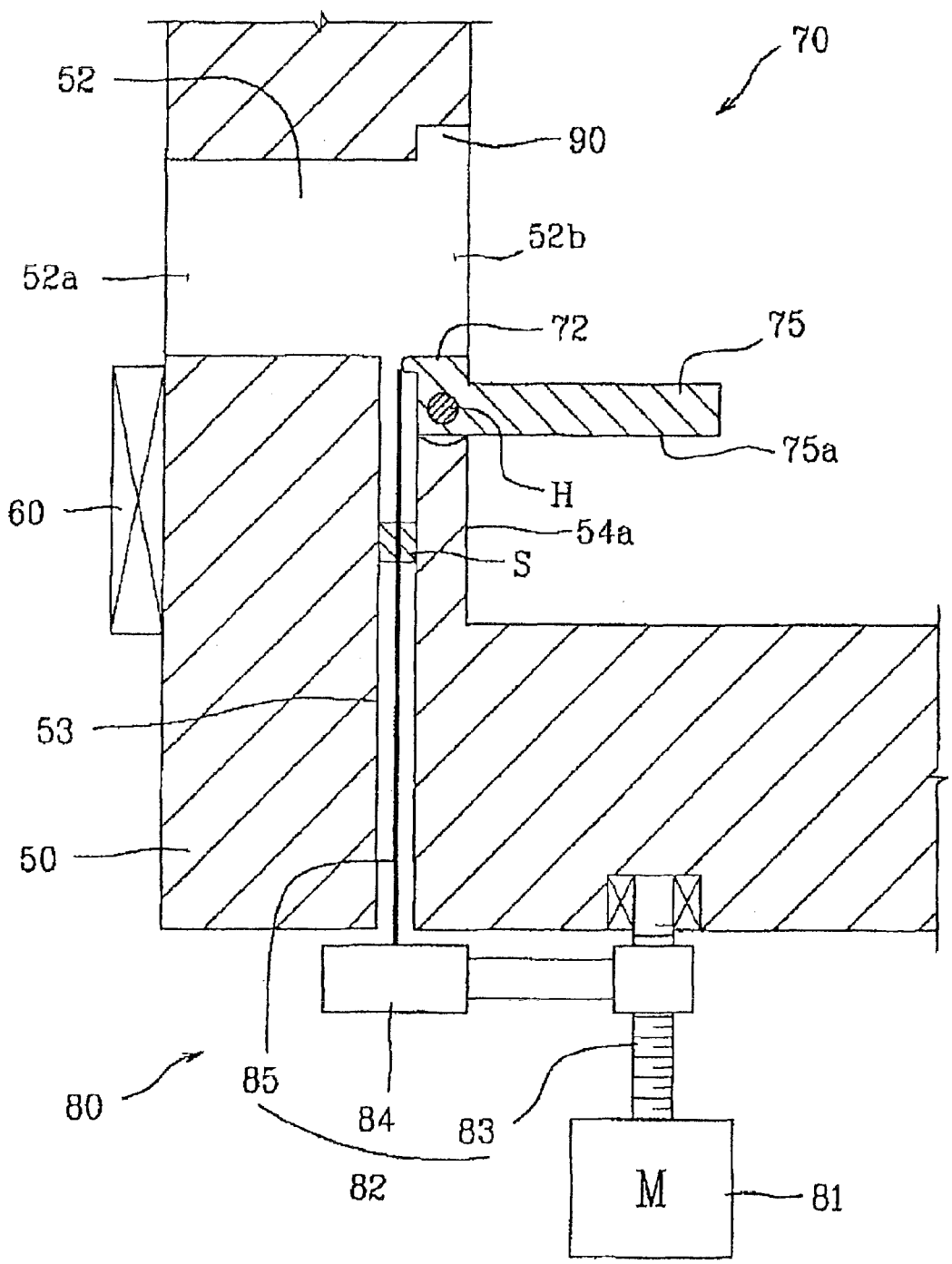

FIGS. 3 and 4 are detailed sectional views of the gate slit opening and closing apparatus 70 of FIG. 2. FIG. 3 shows a state in which the gate slit 52 is open, which FIG. 4 shows a state in which the gate slit 52 is closed.

As illustrated in FIGS. 3 and 4, the gate slit opening and closing apparatus 70 may include an inner door 75 that opens and closes the gate slit 52, a door driving mechanism 80 that opens and closes the inner door 75, and a stopper 90 that prevents the inner door 75 from being closed more than necessary. The inner door 75 may be a plate that is installed on an inner opening 52b of the opposite openings 52a and 52b of the gate slit 52, which is in contact with the interior 54 of the chamber body 50, so as to open and close the inner opening 52b.

The inner door 75 may be coupled to the inner opening 52b by a hinge mechanism H so as to be rotatable around a lower end thereof. Further, when closed, the inner door 75 may have a size such that it is fitted to the inner opening 52b. Thus, when the inner door 75 is rotated toward the interior 54 of the chamber body 50, the inner opening 52b may be opened. Conversely, when the inner door 75 is rotated toward an exterior of the chamber body 50, the inner opening 52b may be closed.

The inner door 75 may be installed to be in the same plane as an inner wall 54a of the chamber body 50 when rotated to close the inner opening 52b, thereby serving as a flat wall together with the inner wall 54a of the chamber body 50. The inner door 75 may be installed with no height difference relative to the inner wall 54a of the chamber body 50 when the inner opening 52b is closed. That is, when the inner opening 52b is closed, the inner door 75 may be installed such that an inner surface 75a thereof, which faces the interior 54 of the chamber body 50, is even with the inner wall 54a. Further, the inner door 75 may be provided with a protrusion 72 at the lower end thereof, which may protrude toward the exterior of the chamber body 50 a predetermined length when closed.

Figure 5:
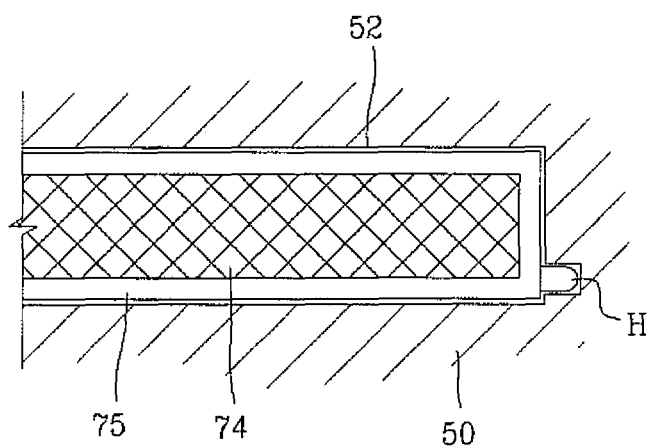
FIG. 5 is a front view when viewed in a direction of the arrow "P" of FIG. 4.

FIG. 5 is a front view when viewed in a direction of the arrow "P" of FIG. 4. As illustrated in FIG. 5, the inner door 75 may be formed from a metallic net 74 in part or in whole. In this embodiment, the inner door 75 has a mesh structure, so that a weight thereof may be reduced.

The door driving mechanism 80 may cause the inner door 75 to be rotated around the hinge mechanism H predetermined angle such that the inner opening 52b of the gate slit 52 is opened and closed. The door driving mechanism 80 may include a power source 81 that generates power, and a power transmission device 82 that transmits the power of the power source 81 to rotate the inner door 75. The power source may be a motor 81 installed outside the chamber body 50.

The power transmission device 82 may function to transmit power of the motor 81 to the inner door 75 through a linear connection passage 53, which may be formed in the chamber body 50 to spatially connect the gate slit 52 with the exterior of the chamber body 50. The power transmission device 82 may include a screw rod 83, a movable block 84, and an operation wire 85.

The screw rod 83 may be a linear rod, which may be installed under the chamber body 50 so as to be disposed just below the inner door 75. The screw rod 83 may be vertically installed under the chamber body 50 so as to be rotatable. Further, the screw rod 83 may have an external thread on its outer circumference along a length thereof, and may be rotated in a forward/reverse direction by the motor 81.

The movable block 84 may be screwed to the screw rod 83 so as to form a screw pair with the screw rod 83. As the screw rod 83 makes forward/reverse rotation (or according to a rotational direction of the screw rod 83), the movable block 84 moves up and down along the screw rod 83.

The operation wire 85 may cause the inner door 75 to be rotated by the force of motion of the movable block 84, moving up and down along the screw rod 83, thereby opening and closing the inner opening 52b. The operation wire 85 may be connected to the inner door 75 and the movable block 84 at opposite ends thereof, respectively.

More, particularly, the operation wire 85 may be connected to the protrusion 72 of the inner door 75. The operation wire 85 may have rigidity. Alternatively, the operation wire 85 may further include a sheath surrounding an outer surface thereof. Further, the operation wire 85 may be inserted through the connection passage 53 of the chamber body 50, and then connected to the inner door 75 and the movable block 84. As described above, when the movable block 84 moves down, the operation wire 85 rotates the inner door 75 such that the inner opening 52b is closed. Although not shown in the figures, a corrugated tube enclosing the operation wire 85 may be installed between the chamber body 50 and the movable block 84 to prevent the operation wire 85 from interfering with its surroundings and improve the appearance thereof.

The motor 81 may be actuated in a way that prevents the movable block 84 from excessively moving up to give rise to an overload (a state in which the motor continues to rotate the screw rod 83 in spite of complete opening or closing of the inner opening 52b). Of course, this may be realized using, for example, a sensor or control device.

The stopper 90 may restrict rotation of the inner door 75, which may be closed by the door driving mechanism 80. The stopper 90 may serve to determine the closed position of the inner door 75, and thus, allow the inner opening 52b of the gate slit 52 to be accurately closed by the inner door 75. The stopper 90 may be implemented as at least one recess or protrusion, which may be formed at the inner opening 52b so as to come in contact with an upper end of the inner door 75 when the inner door 75 closes the inner opening 52b.

The position and configuration of the stopper 90 may be modified. For example, the stopper 90 may be implemented as a ring, which may be installed on the screw rod 83 such that the movable block 84 no longer moves down when the inner opening 52b is completely closed. The function of the stopper 90, as described above, may be realized by controlling actuation of the motor 81. Nevertheless, the stopper 90 may be provided to impose physical restrictions on the rotation of the inner door 75, thereby preventing malfunction, and improving the reliability of operation.

Reference numeral S represents a sealing member, which may be installed in the connection passage 53 in order to maintain an airtight state when the inner opening 52b of the gate slit 52 is closed. The sealing member S may allow the interior 54 of the chamber body 50 to be kept in a vacuum atmosphere by blocking the connection passage 53 so that the operation of the operation wire 85 is not hindered.

The operation of a process chamber according to embodiments disclosed herein will be described below.

To close the gate slit 52, when the inner opening 52b of the gate slit 52 is open, the inner door 75 is lowered, and the movable block 84 of the power transmission device 82 maintains a raised state. In this state, the motor 81, may be actuated. Then, the screw rod 83 is rotated by the rotation of the motor 81. The movable block 84, screwed with the screw rod 83, moves down along the screw rod 83. Since the movement direction of the movable block 84 may be determined by the rotating direction of the screw rod 83, the motor 81 may rotate the screw rod 83 in a direction such that the movable block 84 moves down. As the movable block 84 moves down, the operation wire 85 is pulled. At this time, the inner door 75 is rotated around the hinge mechanism H, and stands erect. When the inner door 75 comes into contact with the stopper 90 and the inner opening 52b is closed, the actuation of the motor 81 is stopped.

In this manner, when the inner opening 52b is closed by the inner door 75, the interior 54 of the chamber body 50 is isolated from the gate slit 52. As a result, the interior 54 of the chamber body 50 is bilaterally symmetrical (see FIG. 2). Further, when the inner opening 52b is closed, the inner door 75 is in the same plane as the inner wall 54a of the chamber body 50. Thus, there is no height difference in the inner wall 54a of the chamber body 50. As a result, when the substrate 30 is etched, the distribution of plasma is uniform.

To open the gate slit 52, unlike when the gate slit 52 is closed, the motor 81 is actuated such that the screw rod 83 is rotated in a reverse direction, and thereby the movable block 84 moves up. At this time, the operation wire 85, which may be rigid, is pushed by the raising force of the movable block 84, thereby pushing the inner door 75. As a result, the inner door 75 is rotated, and thus, the inner opening 52b of the gate slit 52 is opened.

Figure 6:
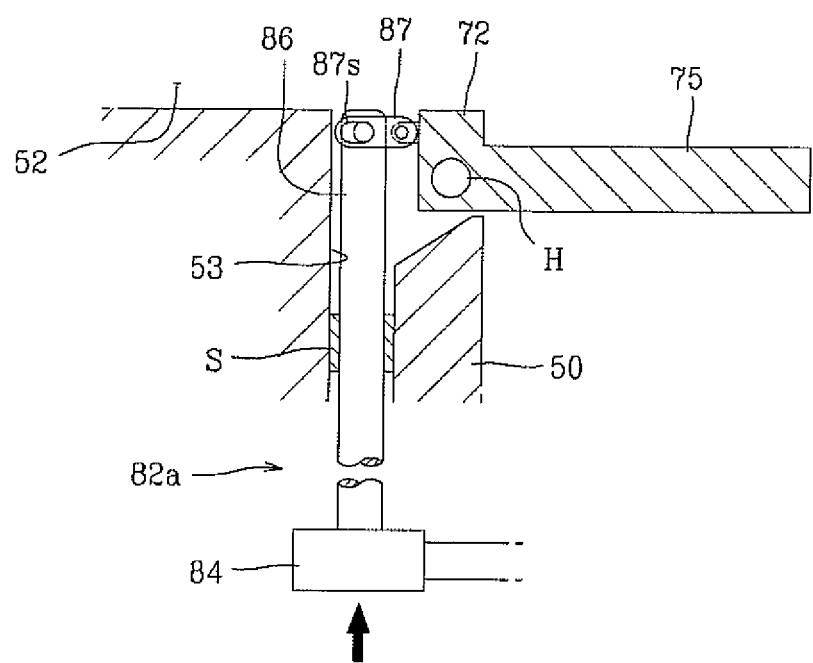
FIGS. 6 and 7 are sectional views illustrating a power transmission device of FIGS. 3 and 4, FIG. 6 showing a state in which the gate slit is open, and FIG. 7 showing a state in which the gate slit is closed.
Figure 7:
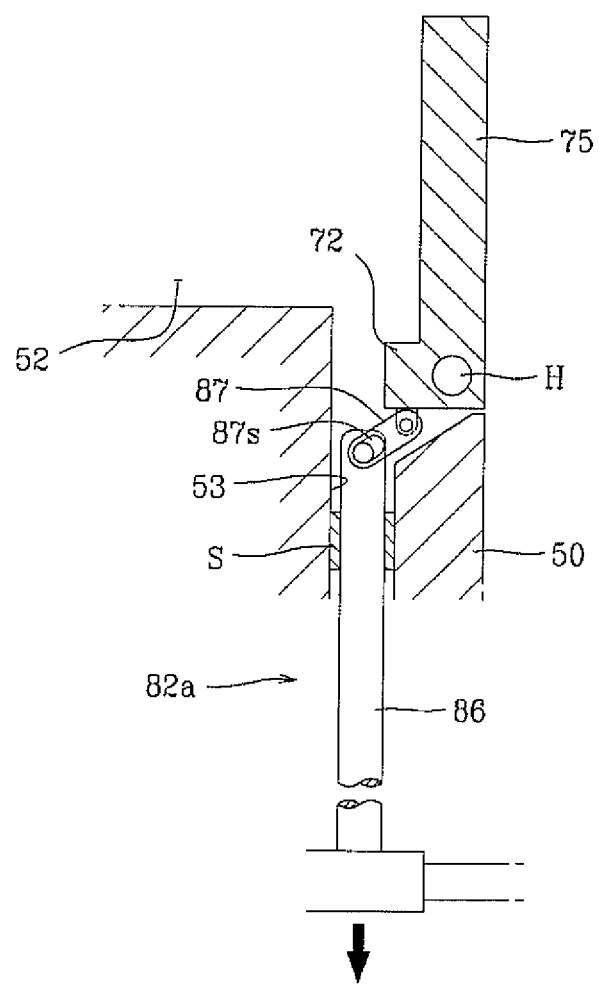

FIGS. 6 and 7 are sectional views illustrating another embodiment of the power transmission device of FIGS. 3 and 4. More particularly FIG. 6 shows a state in which the gate slit 52 is open, while FIG. 7 shows a state in which the gate slit 52 is closed.

The power transmission device 82a illustrated in FIGS. 6 and 7 is different from the power transmission device 82 illustrated in FIGS. 3 and 4, only in that a linear operation rod 86 and a link 87 replace the operation wire 85. Like the operation wire 85, the operation rod 86 is inserted through the connection passage 53 of the chamber body 50, and a lower end thereof is coupled to the movable block 84.

The link 87 couples an upper end of the operation rod 86 with the inner door 75. The link 87 transmits the motion force of the operation rod 86, which may be raised along the connection passage 53 by the movable block 84, to the inner door 75 such that the inner door 75 is rotated. A hole 87s, through which the link 87 may be coupled with the operation rod 86 by a pin joint, may have the shape of a slot. Of course, the link 87 may be modified; that is, the link 87 may have any configuration as long as the inner door 75 may be rotated by the rotation of the operation rod 86. Further, the structure of the power transmission device 82a may be modified; for example, the screw rod 83 may be installed in a horizontal direction rather than in a vertical direction so that the operation rod 86 and the moving block 84 may be coupled.

Figure 8:
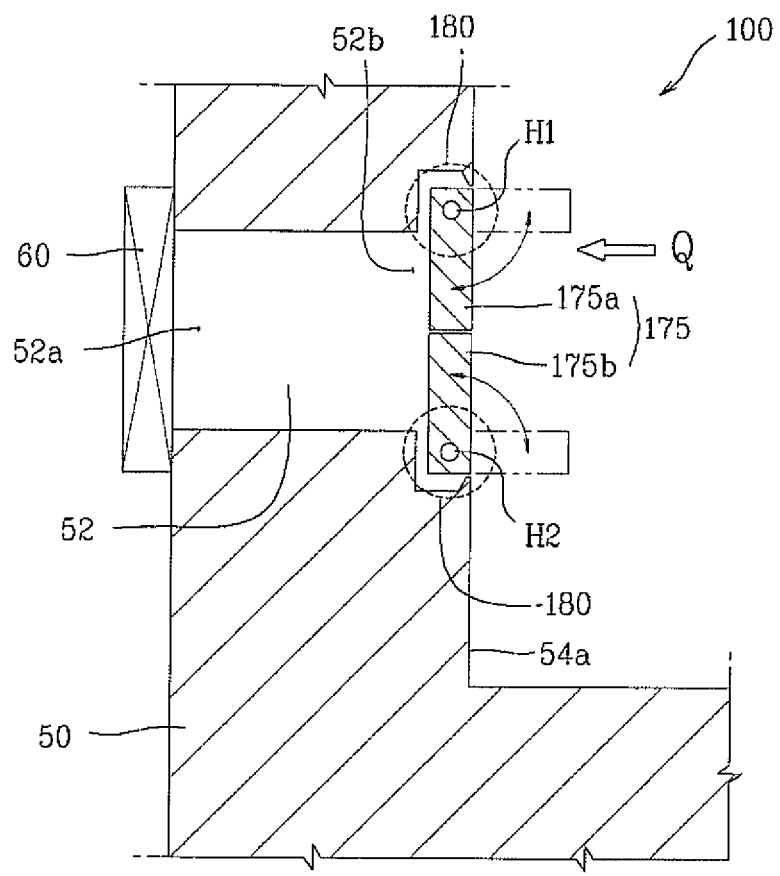
FIG. 8 is a cross-sectional view of a process chamber having a gate slit opening and closing apparatus in accordance with another embodiment.
Figure 9:
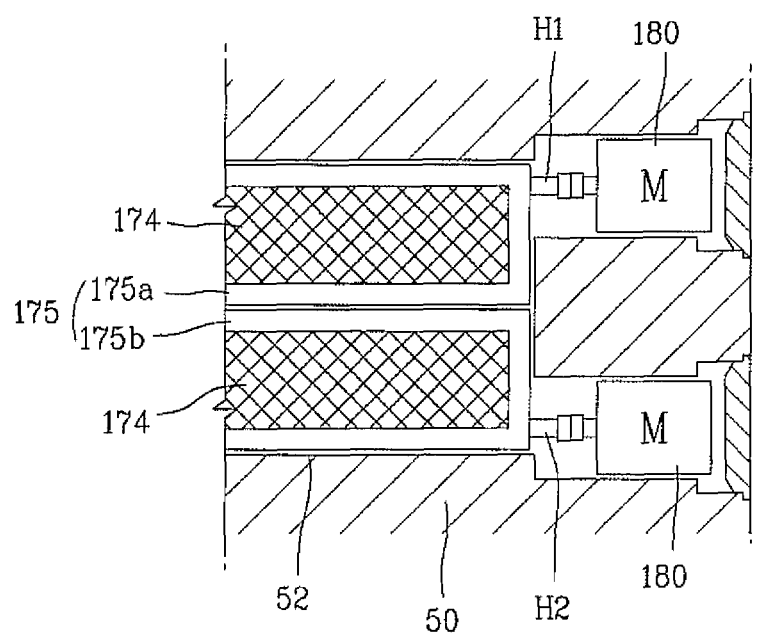
FIG. 9 is a front view when viewed in a direction of the arrow "Q" of FIG. 8.

FIG. 8 is a cross-sectional view of a process chamber 100 having a gate slit opening and closing apparatus 120 in accordance with another second embodiment. FIG. 9 is a front view when viewed in a direction of an arrow "Q" of FIG. 8.

As illustrated in FIGS. 8 and 9, the process chamber 100 having a gate slit opening and closing apparatus 170 in accordance with this embodiment is identical to that of the previous embodiment, except for configurations of an inner door 175 and a door driving mechanism 180.

Like the inner door 75 of the previous embodiment, the inner door 175 of this embodiment opens and closes the inner opening 52b of the gate slit 52. However, unlike the inner door 75 of the previous embodiment, which is designed to have a single opening and closing door, the inner door 175 of this embodiment is designed to have double opening and closing doors. The inner door 175 of this embodiment may include an upper door 175a, which may open and close an upper portion of the inner opening 52b of the gate slit 52, and a lower door 175b, which may be installed on a lower side of the upper door 175a and open and close a remaining, lower portion of the inner opening 52b of the gate slit 52.

The upper door 175a may be coupled to the inner opening 52b by a hinge mechanism H1 so as to be rotatable around an upper end thereof. The lower door 175b may be coupled to the inner opening 52b by a hinge mechanism H2 so as to be rotatable around a lower end thereof. Further, the upper and lower doors 175a and 175b may be equipped with metallic nets 174 so as to have a mesh structure in part or in whole.

Meanwhile, the inner door 175 of this embodiment may open the inner opening 52b when rotated toward the interior 54 of the chamber body 50. Conversely, the inner door 175 may close the inner opening 52b when rotated toward the exterior of the chamber body 50. The inner door 175 may be installed to be in the same plane as the inner wall 54a of the chamber body 50 when closed.

The door driving mechanism 180 of this embodiment may function to rotate the upper and lower doors 175a and 175b such that the inner opening 52b is opened and closed, and may include two motors. The motors may be buried in the wall of the chamber body 50 such that shafts thereof may be directly coupled to the hinge mechanisms H1 and H2 of the upper and lower doors 175a and 175b by means of, for example, couplers, respectively.

Although exemplary embodiments have been described for illustrative purposes, those skilled in the art will appreciate that various modifications, additions and substitutions are possible, without departing from the scope and spirit of the invention as disclosed in the accompanying claims.

As one example, in the description of embodiments disclosed herein, the inner door may be installed so as to be rotated down toward an interior of the chamber body. However, the inner door may be designed to be rotated in a reverse direction to be opened and closed. In this case, a suitable structural change may be made so as to avoid interference between the substrate, which may be loaded and unloaded through the gate slit, and the inner door.

Further, in the description of the door driving mechanism of an embodiment disclosed herein, a motor, as the power source, may be installed outside the chamber body, and the power of the motor may be transmitted to the inner door, located inside the chamber body, by a power transmission device. However, the motor may be designed to be embedded in the wall of the chamber body, or may be installed outside the chamber body such that the shaft thereof may be directly coupled with the hinge mechanism. In addition, in the description of the door driving mechanism of one embodiment, the motor may be embedded in the wall of the chamber body. However, the motor may be installed outside the chamber body.

Embodiments disclosed herein provide a process chamber having a gate slit opening and closing apparatus that opens and closes a gate slit of a chamber body inside the chamber body using at least one rotary door, thereby preventing an interior of the chamber body from being spatially connected with the gate slit when the substrate is etched, and preventing the plasma from being non-uniformly distributed due to concentration of the plasma toward the gate slit.

Embodiments disclosed herein also provide a process chamber having a gate slit opening and closing apparatus, in which at least one door of which is even with an inner wall of a chamber body without a height difference when a gate slit is closed by the gate slit opening and closing apparatus, thereby maintaining a more uniform distribution of plasma when a substrate is etched.

According to one embodiment, a process chamber is provided having a gate slit opening and closing apparatus that includes a chamber body, in one wall of which a gate slit, through which a substrate is loaded and unloaded, is formed, an inner door, one end of which is rotatably installed in an inner opening of opposite openings of the gate slit so as to open and close the inner opening and a door driving mechanism that rotates the inner door such that the inner opening is opened and closed. The process chamber may further include a stopper that restricts rotation of the inner door in the closing direction, and thus, determines the closed position of the inner door.

The inner door may be installed so as to be in the same plane as an inner wall of the chamber body when closing the inner opening. Further, the inner door may have a mesh structure in part or in whole.

The chamber body may include a connection passage that connects an exterior of the chamber body with the gate slit, and the door driving mechanism may include a power source installed outside the chamber body, and a power transmission unit or device that transmits power of the power source to the inner door through the connection passage such that the inner door is opened and closed. The power source may include a motor.

The power transmission device may include a screw rod, which may be rotated in a forward/reverse direction by the motor and an external thread on an outer circumference thereof, a movable block, which may be screwed to the screw rod so as to form a screw pair with the screw rod and an operation wire, which may be inserted into the connection passage and may be coupled to the inner door and the movable block at opposite ends thereof.

Alternatively, the power transmission unit may include a screw rod, which may be rotated in a forward/reverse direction by the motor and which may have an external thread on the outer circumference thereof a movable block, which may be screwed to the screw rod so as to form a screw pair with the screw rod, and an operation rod, which may be inserted into the connection passage and be coupled to the inner door and the movable block at opposite ends thereof by way of a link coupled with at least one of the inner door and the movable block.

According to another embodiment, a process chamber is provided having a gate slit opening and closing apparatus that includes a chamber body, in one wall of which a gate slit, through which a substrate may be loaded and unloaded, is formed, a pair of inner doors, one of which may have one end installed rotatably so as to open and close one side of an inner opening of opposite openings of the gate slit, and the other of which may have one end installed rotatably so as to open and close the other side of the inner opening, and a door driving mechanism that rotates the inner doors such that the inner opening is opened and closed. The inner doors may be installed so as to be in the same plane as an inner wall of the chamber body when closing the inner opening. Further, each of the inner doors may have a mesh structure in part or in whole.

According to such a process chamber having a gate slit opening and closing apparatus according to embodiments disclosed herein, at least one inner door may be installed in the inner opening of the opposite openings of the gate slit, which may function as a gateway for the substrate, and thus, the inner opening may be opened and closed by the inner door. Hence, when the inner opening is closed, the interior of the chamber body may be spatially blocked from the gate slit. Thereby, when the substrate is etched, the plasma may be prevented from being concentrated toward the gate slit. Further, the plasma may be uniformly distributed.

In addition, the inner door may be installed so as to be even with the inner wall of the chamber body when closed, so that the space where the plasma is formed may be accurately symmetrical, and thus, the plasma may be uniformly distributed. Further, this symmetrical structure enables the distance between an electrode and ground to be constant. This is favorable with regards to power.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A process chamber having a gate slit opening and closing apparatus, the process chamber comprising:
    a chamber body;
    a gate slit, through which a substrate is loaded and unloaded into the chamber body, that extends between an interior side and an exterior side of a wall of the chamber body;
    at least one inner door rotatably installed at an inner opening of the gate slit formed at the interior side of the wall of the chamber body so as to open and close the inner opening; and
    a door driving mechanism that rotates the at least one inner door between an opened position and a closed position so as to open and close the inner opening of the gate slit, wherein the at least one inner door is coplanar with the interior side of the wall of the chamber body when the inner opening is closed by the at least one inner door, wherein a connection passage is formed in the chamber body that connects an exterior of the chamber body with the gate slit, and wherein the door driving mechanism comprises a power source installed outside the chamber body and a power transmission device that transmits power of the power source to the at least one inner door through the connection passage to open and close the at least one inner door.

2. The process chamber of claim 1, further comprising a stopper that restricts rotation of the at least one inner door in a closing direction and determines the closed position of the at least one inner door.

3. The process chamber of claim 1, wherein the at least one inner door comprises a mesh structure in part or in whole.

4. The process chamber of claim 1, wherein the power source comprises a motor.

5. The process chamber of claim 4, wherein the power transmission device comprises:
    a screw rod rotated in a forward/reverse direction by the motor and having an external thread on an outer circumference thereof;
    a movable block, which is screwed to the screw rod so as to form a screw pair with the screw rod; and
    an operation wire, which is inserted into the connection passage and coupled to the at least one inner door and the movable block at opposite ends thereof.

6. The process chamber of claim 5, further comprising a sealing member disposed within the connection passage.

7. The process chamber of claim 4, wherein the power transmission device comprises:
    a screw rod rotated in a forward/reverse direction by the motor and having an external thread on an outer circumference thereof;
    a movable block, which is screwed to the screw rod so as to form a screw pair with the screw rod; and
    an operation rod, which is inserted into the connection passage and coupled to the at least one inner door and the movable block at opposite ends thereof by a link coupled with at least one of the at least one inner door and the movable block.

8. The process chamber of claim 7, further comprising a sealing member disposed within the connection passage.

9. The process chamber of claim 1, wherein the at least one inner door comprises at least two inner doors rotatably installed in the inner opening.

10. The process chamber of claim 9, wherein the at least two inner doors are rotatably mounted at opposite ends of the inner opening.

11. The process chamber of claim 10, wherein the door driving mechanism comprises at least two motors.

12. The process chamber of claim 11, wherein the at least two motors are embedded in the wall of the chamber body.

13. The process chamber of claim 1, further comprising a gate valve installed at an outer opening of the gate slit, the outer opening being formed at the exterior side of the wall of the chamber body, opposite the inner opening.

14. A process chamber having a gate slit opening and closing apparatus, the process chamber comprising:
a chamber body;
a gate slit, through which a substrate is loaded and unloaded, that extends through a wall of the chamber body, the gate slit having inner and outer openings respectively formed at inner and outer sides of the wall of the chamber body;
at least one inner door having one end thereof rotatably installed in the inner opening of the gate slit so as to open and close the inner opening; and
a door driving mechanism that rotates the at least one inner door such that the inner opening is opened and closed, wherein the at least one inner door is coplanar with the inner side of the wall of the chamber body when the inner opening is closed by the at least one inner door, and wherein the at least one inner door comprises a mesh structure in whole.

15. The process chamber of claim 14, further comprising a connection passage formed in the chamber body that connects an exterior of the chamber body with the gate slit, wherein the door driving mechanism comprises a power source installed outside the chamber body, and a power transmission device that transmits power of the power source to the at least one inner door through the connection passage to open and close the at the least one inner door.

16. A process chamber having a gate slit opening and closing apparatus, the process chamber comprising:
a chamber body;
a gate slit, through which a substrate is loaded and unloaded, formed in a wall of the chamber body;
a pair of inner doors, comprising a first inner door having an end thereof rotatably installed so as to open and close one side of an inner opening of the gate slit, and a second inner door having an end thereof rotatably installed so as to open and close another side of the inner opening of the gate slit; and
a door driving mechanism that rotates the pair of inner doors to open and close the inner opening of the gate slit, wherein the pair of inner doors are coplanar with an inner wall of the chamber body when the inner opening of the gate slit is closed by the pair of inner doors.

17. The process chamber of claim 16, wherein each of the pair of inner doors comprises a mesh structure in part or in whole.

18. The process chamber of claim 16, wherein the door driving mechanism comprises at least two motors.

19. The process chamber of claim 18, wherein the at least two motors are embedded in the wall of the chamber body.

* * * * *